(12) United States Patent
Kim et al.

(10) Patent No.: US 7,368,821 B2
(45) Date of Patent: May 6, 2008

(54) BGA SEMICONDUCTOR CHIP PACKAGE AND MOUNTING STRUCTURE THEREOF

(75) Inventors: Sang-Young Kim, Cheonan-si (KR); Jin-Ho Kim, Cheonan-si (KR); Hee-Jin Park, Cheonan-si (KR); Young-Hee Song, Seongnam-si (KR); Tae-Sung Yoon, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 49 days.

(21) Appl. No.: 11/231,751

(22) Filed: Sep. 22, 2005

(65) Prior Publication Data

US 2006/0231952 A1  Oct. 19, 2006

(30) Foreign Application Priority Data

Apr. 19, 2005  (KR) ...................... 10-2005-0032180

(51) Int. Cl.
*H01L 23/48* (2006.01)
*H01L 23/52* (2006.01)

(52) U.S. Cl. ...................... 257/738; 257/693; 257/773; 257/776; 257/784; 257/786; 257/E23.021; 257/E23.069

(58) Field of Classification Search ................ 257/737, 257/738, 772, 777–795, E23.021, E21.508, 257/E21.509, E21.519, E23.015, E23.02, 257/E23.023–E23.079; 438/612–617; 228/180.22
See application file for complete search history.

(56) References Cited

U.S. PATENT DOCUMENTS 6,380,621 B1 *  4/2002  Ando et al. .................. 257/707

2003/0102535 A1 *  6/2003  Burnette et al. ............ 257/659
2004/0183205 A1 *  9/2004  Yamaguchi ................ 257/774

FOREIGN PATENT DOCUMENTS

| JP | 9-64519 | 3/1997 |
| JP | 10-112478 | 4/1998 |
| JP | 2003-017530 | 1/2003 |
| JP | 2003-100801 | 4/2003 |
| KR | 10-2004-0014177 | 2/2004 |

OTHER PUBLICATIONS

Korean Office Action dated Jul. 31, 2006.

* cited by examiner

*Primary Examiner*—Jasmine Clark
(74) *Attorney, Agent, or Firm*—Harness, Dickey & Pierce, P.L.C.

(57) ABSTRACT

In example embodiments of the present invention, a structure of a BGA semiconductor chip package includes a substrate having first and second surfaces, a semiconductor chip having a plurality of bonding pads, and mounted on the first surface of the substrate, and plurality of in/out (I/O) solder balls and dummy solder balls provided on the second surface of the substrate, wherein the I/O solder balls are electrically connected to the semiconductor chip and the dummy solder balls are electrically isolated from the semiconductor chip, and the I/O solder balls and the dummy solder balls have the same ball size and ball pitch and are uniformly provided over the second surface of the substrate.

20 Claims, 6 Drawing Sheets

BGA SEMICONDUCTOR CHIP PACKAGE AND MOUNTING STRUCTURE THEREOF

CLAIM OF PRIORITY

A claim of priority under 35 U.S.C. §119 is made to Korean Patent Application No. 2005-32180, filed on Apr. 19, 2005, the entire contents of which are incorporated herein by reference.

BACKGROUND OF THE INVENTION

1. Field of the Invention

Example embodiments of the present invention generally relate to a semiconductor chip package and a mounting structure thereof. More particularly, the present invention relates to a BGA semiconductor chip package and a mounting structure thereof.

2. Description of the Related Art

A ball grid array (BGA) package may include external connection terminals, for example, solder balls, distributed over a surface of the package. The BGA package was developed in response to increased integration of semiconductor devices and increased number of I/O pins. The BGA package may have a reduced mounting area and/or improved electrical characteristics.

BGA packages may be categorized as a solder mask defined (SMD) type or a non-solder mask defined (NSMD) type. As illustrated in FIG. 1, a SMD type BGA package 510 may include ball land pads 524 defined by a solder mask 527. As illustrated in FIG. 2, an NSMD type BGA package 610 may include ball land pads 624 spaced from a solder mask 627.

Compared with the NSMD type BGA package 610, the SMD type BGA package 510 generally has a larger contact area for solder balls 551 with a substrate 520, and thereby, generally has relatively strong resistance against external shock. However, the SMD type BGA package 510 generally has a smaller contact area for the solder balls 551 with the ball land pads 524. In some instances, problems, for example, solder joint cracks and package cracks (C and A, respectively, in FIG. 1) may occur in the SMD type BGA package 510.

Compared with the SMD type BGA package 510, the NSMD type BGA package 610 may have a larger contact area for solder balls 651 with the ball land pads 624, which may improve electrical characteristics. However, the NSMD type BGA package 610 generally has a smaller contact area for the solder balls 651 with a substrate 620; which may mean the NSMD type BGA package 610 has a relatively weaker resistance against external shock. In some instances, problems, for example, peeling D of the ball land pads 624 and package cracks B may occur.

As described above, the SMD type BGA package 510 and the NSMD type BGA package 610 may both have weaknesses. These weaknesses may cause problems, for example package cracks A, B solder joint cracks C, and/or peeling D. In the case of a package having a tape wiring substrate chip, during a bending test or handling by an operator, mechanical stresses may generate cracks A, B in areas where solder balls are not formed.

As a result, as shown in FIG. 3, an underfill resin 697 may be used between the NSMD type BGA package 610 and a mounting substrate 690. However, the use of the underfill resin 697 may result in an increase in manufacturing cost. In addition, the underfill resin 697 may make the package more difficult to repair.

Also, when the SMD type BGA package 510 is mounted on a mounting substrate 590, the height of the solder balls 551 may decrease, as illustrated in FIG. 4. For example, a height of solder balls 551 with a diameter of 450 μm is between 340 μm and 350 μm. After the package 510 is mounted on the mounting substrate 590, the height of the solder balls 551 may be decreased to between 270 μm and 300 μm. The decrease in height reduces the space between the SMD type BGA package 510 and the mounting substrate 590. Heat, which is generated by a chip mounted on the SMD type BGA package 510 during operation, may be trapped in the reduced space between the SMD type BGA package 510 and the mounting substrate 590. The resulting thermal stresses may also cause solder joint cracks.

One conventional method to solve these problems, using nonfusible balls 752, is illustrated in FIG. 5. The nonfusible balls 752 do not melt during a soldering reflow process. The nonfusible balls 752 may help the BGA package to maintain the height of the solder balls 751.

Although the technique disclosed in the BGA package 710 is generally acceptable, it is not without shortcomings. For example, the BGA package 710 may require an additional process to form the nonfusible balls 752. This may lead to a more complicated manufacturing process. In addition, because the nonfusible balls 752 are connected to connection pads 793b of a mounting substrate 790, the connection pads 793b must be considered when designing wiring patterns for the mounting substrate 790. Further, package cracks may still occur at areas where the solder balls 751 and/or nonfusible balls 752 are not formed.

SUMMARY OF THE INVENTION

In an example embodiment of the present invention, a structure of a BGA semiconductor chip package includes a substrate having first and second surfaces, a semiconductor chip having a plurality of bonding pads, and mounted on the first surface of the substrate, and plurality of in/out (I/O) solder balls and dummy solder balls provided on the second surface of the substrate, wherein the I/O solder balls are electrically connected to the semiconductor chip and the dummy solder balls are electrically isolated from the semiconductor chip, and the I/O solder balls and the dummy solder balls have the same ball size and ball pitch and are uniformly provided over the second surface of the substrate.

In another embodiment of the present invention, a mounting structure of a BGA semiconductor chip package, the mounting structure includes a BGA semiconductor chip package including, a substrate having first and second surfaces, a semiconductor chip mounted on the first surface of the substrate, and having a plurality of bonding pads on a side not mounted to the substrate, and plurality of in/out (I/O) solder balls and dummy solder balls provided on the second surface of the substrate. The structure further includes a mounting substrate including connection pads and one or more protective layers, wherein the I/O solder balls are connected to the connection pads and the dummy solder balls are connected to the protective layer(s), and wherein a height of the protective layer(s) is higher than a height of the connection pads.

In another embodiment of the present invention, a mounting structure of a BGA semiconductor chip package, the mounting structure includes a BGA semiconductor chip package including, a substrate having first surface, second surface, and a window therein, a semiconductor chip mounted on the first surface of the substrate, and having a plurality of bonding pads provided within the window, and plurality of in/out (I/O) solder balls and dummy solder balls provided on the second surface of the substrate. The structure further includes a mounting substrate including connection pads and one or more protective layers, wherein the I/O solder balls are connected to the connection pads and the dummy solder balls are connected to the protective layer(s), and wherein a height of the protective layer(s) is higher than a height of the connection pads.

BRIEF DESCRIPTION OF THE DRAWINGS

Example embodiments of the present invention will be readily understood with reference to the following detailed description thereof provided in conjunction with the accompanying drawings, wherein like reference numerals designate like structural elements.

These drawings are provided for illustrative purposes only and are not drawn to scale. The spatial relationships and relative sizing of the elements illustrated in the various embodiments may have been reduced, expanded or rearranged to improve the clarity of the figure with respect to the corresponding description. The figures, therefore, should not be interpreted as accurately reflecting the relative sizing or positioning of the corresponding structural elements that could be encompassed by an actual device manufactured according to the example embodiments of the invention.

DETAILED DESCRIPTION OF EXAMPLE EMBODIMENTS

Figure 1:
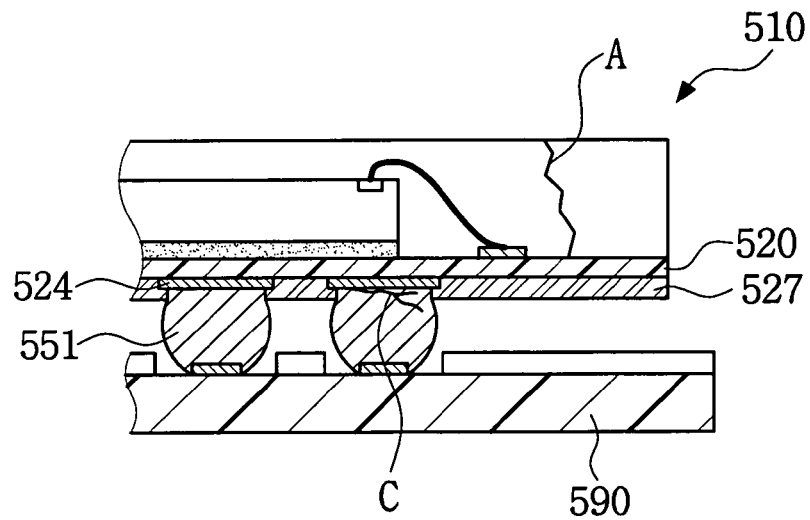
FIG. 1 is a cross-sectional view of an example of a conventional BGA semiconductor chip package and a mounting structure.
Figure 2:
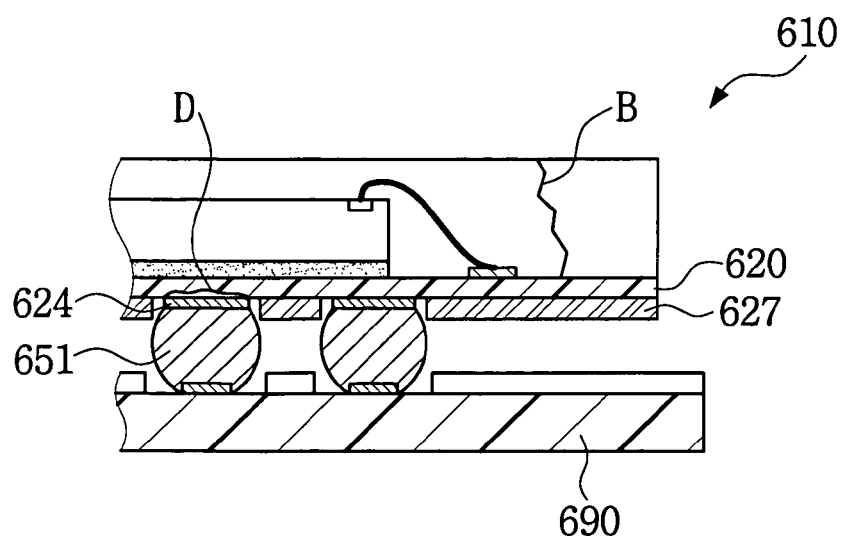
FIG. 2 is a cross-sectional view of another example of a conventional BGA semiconductor chip package and a mounting structure.
Figure 3:
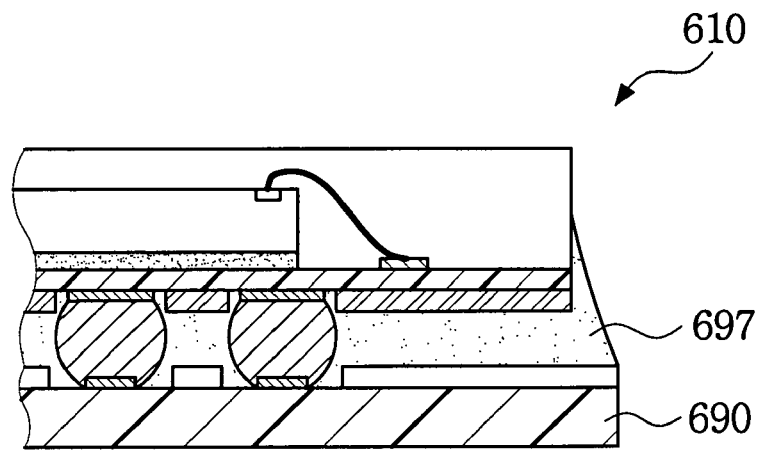
FIG. 3 is a cross-sectional view of another example of a conventional BGA semiconductor chip package and a mounting structure.
Figure 4:
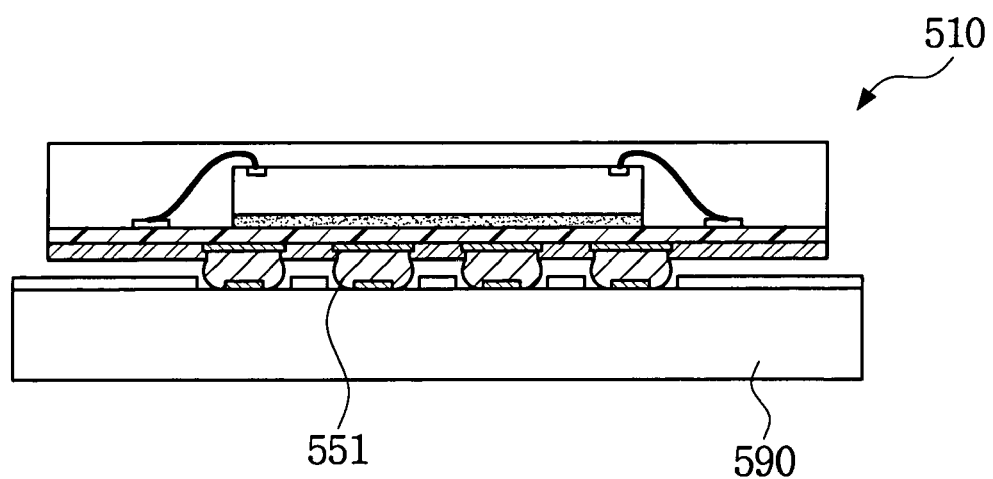
FIG. 4 is a cross-sectional view illustrating a reduced height of solder balls in a mounting structure of the BGA semiconductor chip package of FIG. 1.
Figure 5:
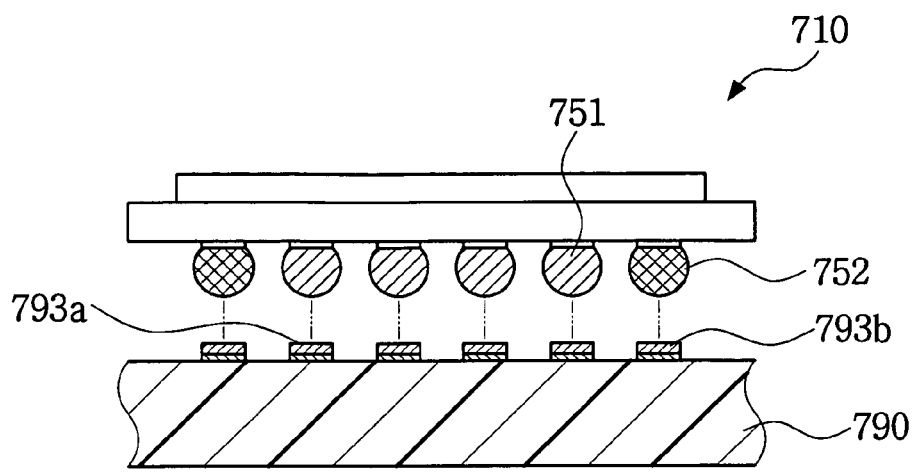
FIG. 5 is a cross-sectional view of another example of a conventional BGA semiconductor chip package and a mounting structure.

Example, non-limiting embodiments of the present invention will now be described more fully hereinafter with reference to the accompanying drawings. This invention may, however, be embodied in many different forms and should not be construed as limited to the example embodiments set forth herein. Rather, the disclosed embodiments are provided as working examples. The principles and features of this invention may be employed in varied and numerous embodiments without departing from the scope of the invention.

Further, well-known structures and processes are not described or illustrated in detail to avoid obscuring the present invention. Like reference numerals are used for like and corresponding parts of the various drawings.

Figure 6A:
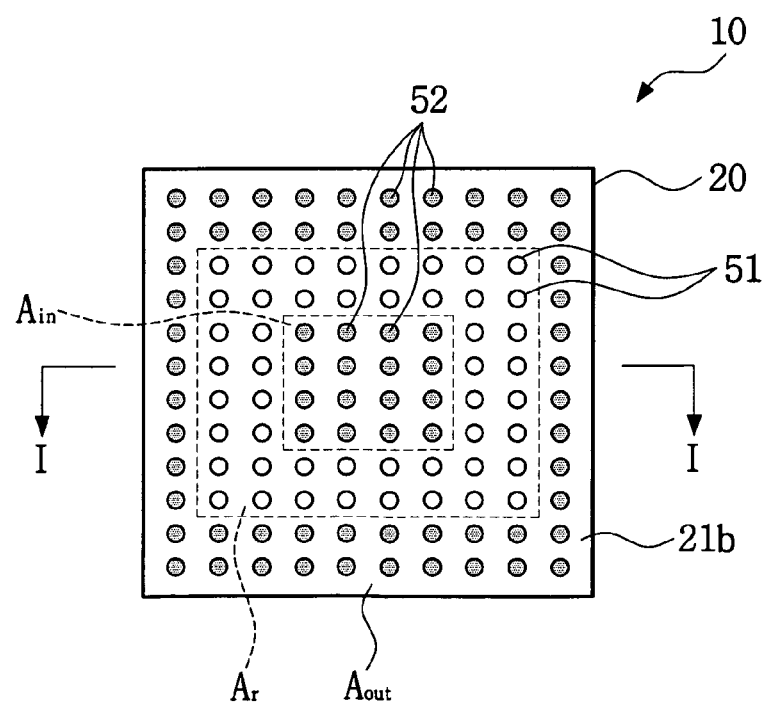
FIG. 6A is a plan view of a BGA semiconductor chip package in accordance with an example embodiment of the present invention.
Figure 6B:
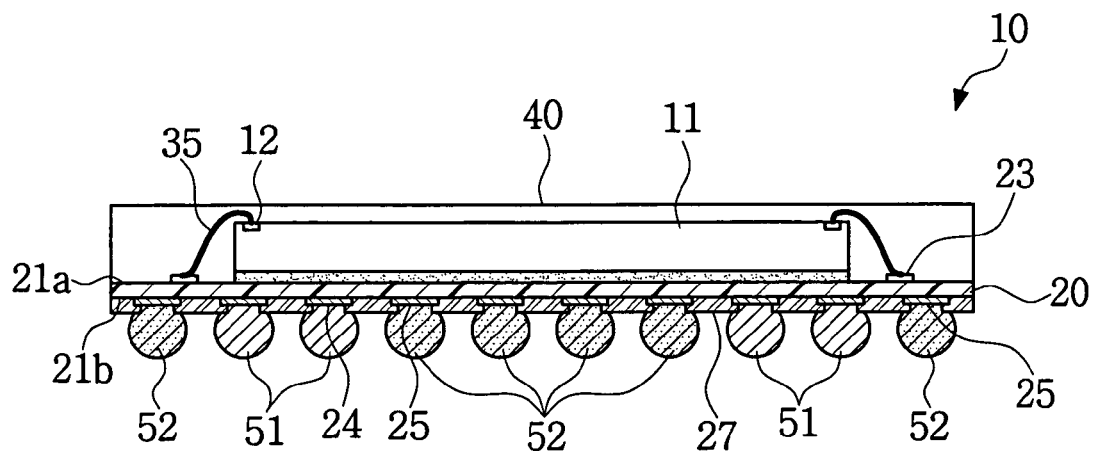
FIG. 6B is a cross-sectional view taken along the line I-I of FIG. 6A.

FIG. 6A is a plan view of a BGA package 10 in accordance with an example embodiment of the present invention. FIG. 6B is a cross-sectional view taken along the line I-I of FIG. 6A.

Referring to FIGS. 6A and 6B, the BGA package 10 may comprise a substrate 20 having a first surface 21a and a second surface 21b, and a semiconductor chip 11 having bonding pads 12. The semiconductor chip 11 may be mounted on the first surface 21a of the substrate 20. A plurality of in/out (I/O) solder balls 51 and dummy solder balls 52 may be provided on the second surface 21b of the substrate 20. The I/O solder balls 51 may serve an electrical function. The dummy solder balls 52 need not serve an electrical function. The I/O solder balls 51 and dummy solder balls 52 may be provided over the second surface 21b uniformly or substantially uniformly, for example in a matrix arrangement.

The substrate 20 may be a wiring substrate having wiring patterns provided on both surfaces 21a and 21b of the substrate 20. The substrate 20 may have substrate pads 23 provided on the first surface 21a and ball land pads 24 and dummy ball land pads 25 provided on the second surface 21b. The ball land pads 24 and dummy ball land pads 25 may be defined by a solder mask 27 as in an SMD type ball land pad structure. The ball land pads 24 may be electrically connected to the substrate pads 23, and the dummy ball land pads 25 may be electrically isolated from the substrate pads 23. The solder mask 27 may be formed of a photo solder resist.

For the BGA package 10, the substrate 20 may be relatively thin, for example, a wiring substrate and a printed circuit board.

The semiconductor chip 11 may be mounted on the first surface 21a of the substrate 20. The semiconductor chip 11 may be an edge pad-type semiconductor chip, in which the bonding pads 12 may be formed along the periphery of the chip 11. The bonding pads 12 may be electrically connected to the corresponding substrate pads 23 by bonding wires 35. An encapsulant 40 may be formed on the first surface 21a of the substrate 20 to protect the semiconductor chip 11, the bonding wires 35, and the bonding area.

The I/O solder balls 51 may be provided on the ball land pads 24, and the dummy solder balls 52 may be provided on the dummy ball land pads 25. The I/O solder balls 51 and the dummy solder balls 52 may be of the same size or substantially the same size and may be formed of the same or substantially the same solder material. The I/O solder balls 51 may be electrically connected to the semiconductor chip 11 through the substrate pads 23, whereas the dummy solder balls 52 may be electrically isolated from the semiconductor chip 11. The I/O solder balls 51 may serve an electrical function, for example signal input/output, power or ground. On the other hand, the dummy solder balls 52 need not serve an electrical function. The I/O solder balls 51 and the dummy solder balls 52 may be provided over the second surface 21b of the substrate 20 in a matrix arrangement.

The I/O solder balls 51 may be arranged in a shape of a square (Ar). The dummy solder balls 52 may be provided in an area (Ain) inside the square (Ar) and/or an area (Aout) outside of the square (Ar). More generally, the dummy solder balls 52 may surround the I/O solder balls 51. The I/O solder balls 51 and the dummy solder balls 52 may have a uniform or substantially uniform pitch.

Figure 7:
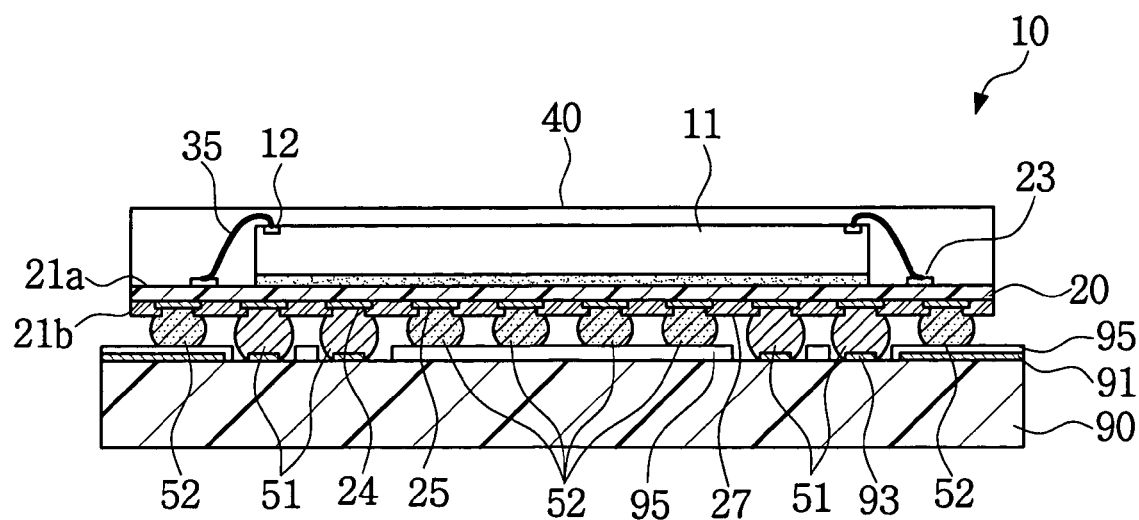
FIG. 7 is a cross-sectional view of a mounting structure of the BGA semiconductor chip package of FIGS. 6A and 6B.

Referring to FIG. 7, a mounting substrate 90 may have wiring patterns 91 and connection pads 93 provided on a surface thereof. The connection pads 93 may be formed corresponding to the I/O solder balls 51. A protective layer 95 may be provided on the mounting substrate 90 corresponding to the dummy solder balls 52. Therefore, the BGA package 10 may have the I/O solder balls 51 connected to the connection pads 93 and the dummy solder balls 52 in contact with the protective layer 95. The protective layer 95 may be formed of a photo solder resist.

The dummy solder balls 52 may melt together with the I/O solder balls 51 during a melting process. During the melting process, the I/O solder balls 51 connect to the connection pads 93 and may decrease in height due to surface tension, while the dummy solder balls 52 connect to the protective layer 95, to support the I/O solder balls 51 and to maintain the height of the I/O solder balls 51. Because the protective layer 95 is generally higher than the connection pads 93, when package load is transferred to the I/O solder balls 51, the dummy solder balls 52 absorb the package load. Therefore, the dummy solder balls 52 may reduce the likelihood of the height of the I/O solder balls from being decreased. Thereby, solder joint cracks that may occur due to thermal stresses caused by the decreased height of the I/O solder balls 51 may be reduced or prevented.

The I/O solder balls 51 and dummy solder balls 52 may be formed of the same or substantially the same material, thus, overcoming the conventional drawback for the need of an additional process to form nonfusible balls.

The dummy solder balls 52 may provide a support against external shock. The I/O solder balls 51 may be provided over a surface of the substrate 20, and the dummy solder balls 52 may be formed on an area where the I/O solder balls 51 are not formed. Therefore, the dummy solder balls 52 may provide a support against mechanical stresses caused by external shock, thereby reducing or eliminating the need for an underfill resin. The dummy solder balls 52 also may lead to reduction of package cracks.

The dummy solder balls 52 may be melted with the I/O solder balls 51, but need not provide an electrical connection to the mounting substrate 90. The dummy solder balls 52 may not require connection pads for the dummy solder balls 52 in the mounting substrate 90. Therefore, the dummy solder balls 52 do not influence a design for wiring patterns of the mounting substrate 90.

As described above, the I/O solder balls 51 and the dummy solder balls 52 may have the same or substantially the same ball size and/or ball pitch, and may be provided uniformly or substantially uniformly over a surface of the substrate 20. The BGA package 10 of an example embodiment may share a single test socket with different kinds of BGA packages having the same outward structure. In this example, different kinds of BGA packages may be different in terms of quantity and/or position of I/O solder balls 51 and/or dummy solder balls 52. A test socket may be configured to have test terminals formed corresponding to the solder balls. The test terminals may control input and/or output of test signals.

For example, a BGA package having eighty-four (84) I/O solder balls may have thirty-six (36) dummy solder balls. Another BGA package having sixty (60) I/O solder balls may have sixty (60) dummy solder balls. The I/O solder balls and the dummy solder balls may have the same or substantially the same ball size and/or ball pitch. Therefore, the two BGA packages may have wholly similar ball matrix structure, thereby allowing a test using a single test socket.

Figure 8A:
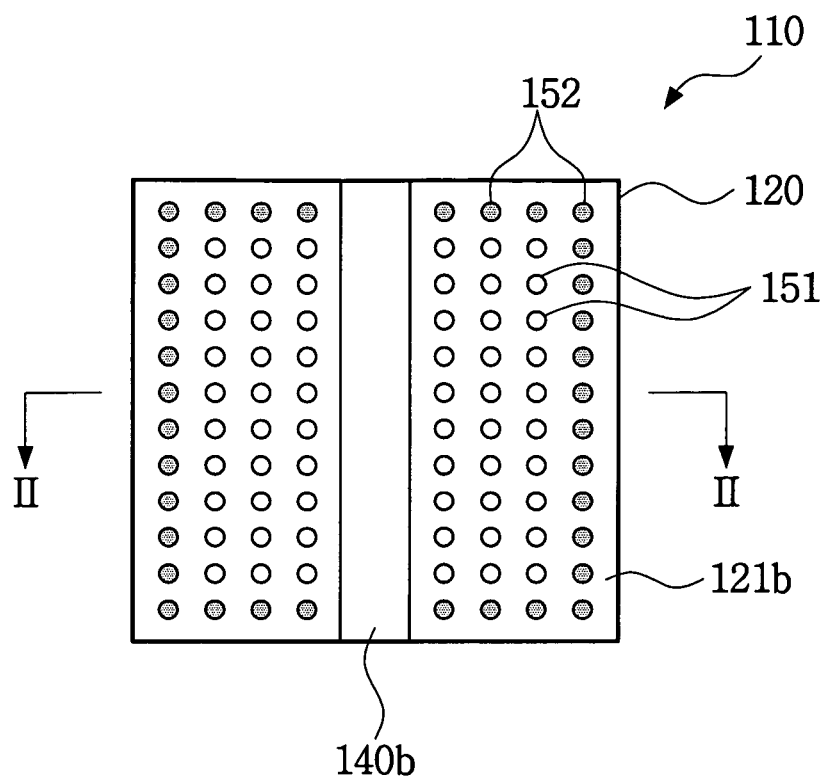
FIG. 8A is a plan view of a BGA semiconductor chip package in accordance with another example embodiment of the present invention.
Figure 8B:
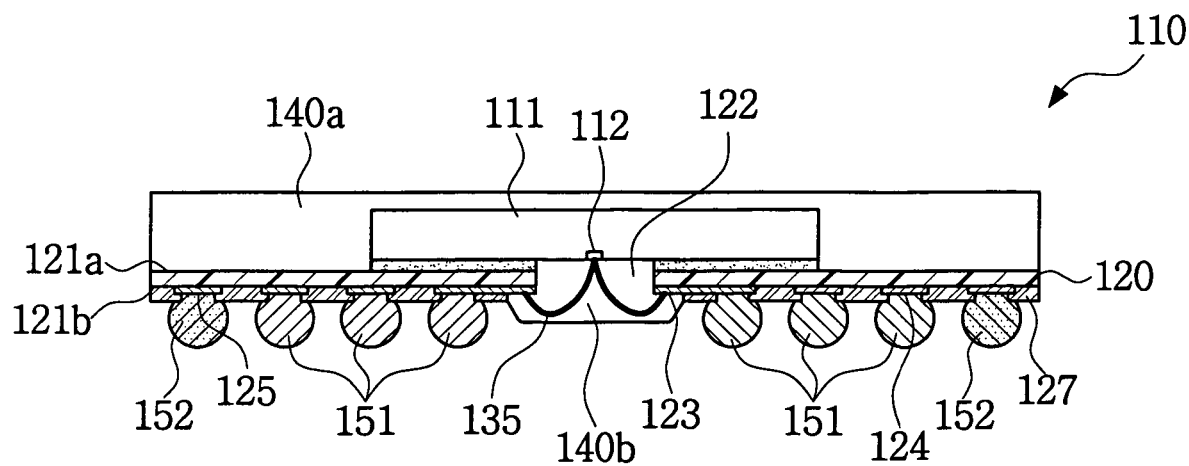
FIG. 8B is a cross-sectional view taken along the line II-II of FIG. 8A.

FIG. 8A is a plan view of a BGA package 110 in accordance with another example embodiment of the present invention. FIG. 8B is a cross-sectional view taken along the line II-II of FIG. 8A.

Referring to FIGS. 8A and 8B, the BGA package 110 may have a similar structure as that of the above described example embodiments, except that I/O solder balls 151 and dummy solder balls 152 may be symmetrically provided with regard to a lower encapsulant 140*b*.

A substrate 120 may have a first surface 121*a* and a second surface 121*b*. A window 122 may be formed in the substrate 120, for example, at the center. The second surface 121*b* may have substrate pads 123 and ball land pads 124 and dummy ball land pads 125 provided around the window 122. The ball land pad 124 may be electrically connected to the substrate pads 123. The dummy ball land pad 125 need not be electrically connected to the substrate pads 123.

A semiconductor chip 111 may be mounted on the first surface 121*a*. The semiconductor chip 111 may be an edge pad-type semiconductor chip, in which bonding pads 112 may be formed along the edges of the semiconductor chip 111. The bonding pad-forming surface of the semiconductor chip 111 may be attached to the first surface 121*a* of the substrate 120. The bonding pads 112 may be located within the window 122 and electrically connected to the substrate pads 123 using bonding wires 135 passing through the window 122. An upper encapsulant 140*a* may seal the first surface 121*a* of the semiconductor chip 111. The lower encapsulant 140*b* may seal the bonding wires 135 and bonding areas.

The I/O solder balls 151 and the dummy solder balls 152 may be formed of the same solder materials. The I/O solder balls 151 may be electrically connected to the semiconductor chip 111 and the dummy solder balls 152 may be electrically isolated from the semiconductor chip 111. The I/O solder balls 151 and the dummy solder balls 152 may be symmetrically provided with regard to the lower encapsulant 140*b*. The I/O solder balls 151 and the dummy solder balls 152 may be provided in a matrix arrangement having the same or substantially the same ball size and/or ball pitch.

The dummy solder balls 152 may be arranged along one or more edges of the second surface 121*b*, similar to the other example embodiments. The BGA package 110 of example embodiments may have a similar effect as example embodiments discussed above with regard to FIGS. 6-7.

Although the above described example embodiments shows a SMD type ball land pad, an NSMD type ball land pad may also be implemented in example embodiments. The SMD type ball land pad may reduce the likelihood of package cracks. The NSMD type ball land pad may reduce the likelihood of solder joint cracks.

Figure 9:
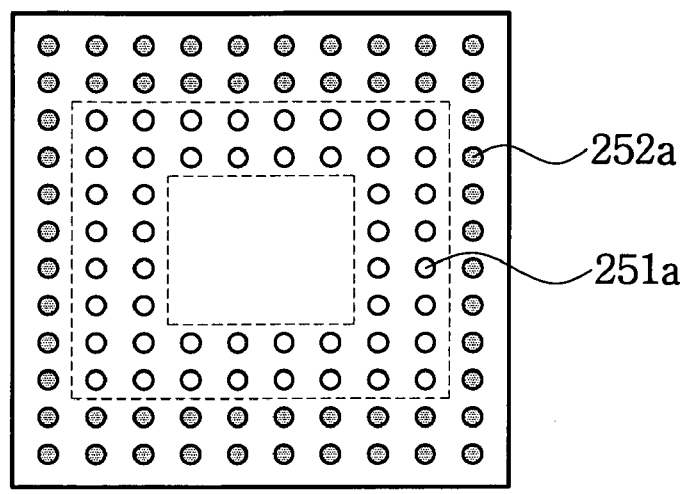
FIG. 9 is a plan view of a BGA semiconductor chip package in accordance with another example embodiment of the present invention.
Figure 10:
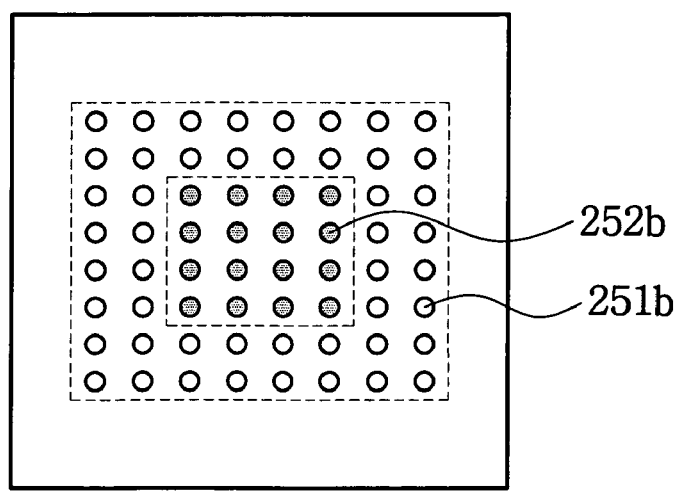
FIG. 10 is a plan view of a BGA semiconductor chip package in accordance with another example embodiment of the present invention.

Although the I/O solder balls 151 and the dummy solder balls 152 may be uniformly provided over a surface of the substrate 120, the solder balls may not be provided on a portion on the surface of the substrate 120. For example, as illustrated in FIG. 9, dummy solder balls 252*a* may not be provided in an area inside a square, or the dummy solder balls 252*a* may not be provided in an area outside a square, as illustrated in FIG. 10.

The BGA package may be formed of Sn and Pb having a weight ratio of 63 to 37, for example, although the weight ratio and solder material need not be limited thereto. For example, the solder material may include a smokeless solder.

The BGA package may include a variety of semiconductor devices capable of using solder balls as external connection terminals. For example, the BGA package may include a single-product semiconductor chip package used in mobile products, such as a TBGA package and a FBGA package, or a semiconductor module having a plurality of semiconductor chip packages. The BGA package may also include chip stack packages having a plurality of chips or package stack packages having a plurality of packages.

Although the ball land pads are formed on an opposite surface to the chip mounting surface of the substrate, the ball land pads may be formed on the chip mounting surface of the substrate.

In accordance with example embodiments of the present invention, dummy solder balls may absorb external shock and/or provide support for I/O solder balls. A BGA package of example embodiments of the present invention may have resistance against external shock without the need for a protective cap or an underfill. Therefore, the likelihood of package cracks may be reduced without an increase of assembly costs.

The BGA package and a mounting structure may provide dummy solder balls which maintain a certain height of I/O solder balls, thereby reducing the likelihood of solder joint cracks or peeling of wiring patterns, which improves the solder joint.

The BGA package may share a single test socket to test various kinds of packages, thereby reducing time and/or costs required for the development of test sockets depending on type of packages.

The BGA package may provide I/O solder balls contacting a protective layer, thereby providing free design for wiring patterns.

Although example, non-limiting embodiments of the present invention have been described in detail hereinabove, it should be understood that many variations and/or modifications of the basic inventive concepts herein taught, which may appear to those skilled in the art, may still fall within the scope of the example embodiments of the present invention.

What is claimed is:

1. A structure of a BGA semiconductor chip package comprising:
    a substrate having first and second surfaces;
    a semiconductor chip having a plurality of bonding pads and mounted on the first surface of the substrate; and
    plurality of in/out (I/O) solder balls and dummy solder balls provided on the second surface of the substrate,
    wherein the I/O solder balls are electrically connected to the semiconductor chip and the dummy solder balls are electrically isolated from the semiconductor chip, and the I/O solder balls and the dummy solder balls have the same ball size and ball pitch and are uniformly provided over the second surface of the substrate.

2. The structure of claim 1, further comprising a mounting substrate including connection pads and one or more protective layers, wherein the I/O solder balls are connected to the connection pads and the dummy solder balls are connected to the one or more protective layers, and wherein a height of the one or more protective layers is higher than a height of the connection pads.

3. The structure of claim 1, wherein the I/O solder balls are arranged in a shape of a square, and wherein the dummy solder balls are provided in an area inside of the square, an area outside of the square, or area inside and outside of the square.

4. The structure of claim 1, wherein the I/O solder balls and the dummy solder balls are provided in a matrix arrangement.

5. The structure of claim 1, wherein the bonding pads are on a side of the semiconductor chip not mounted to the first surface of the substrate, and the bonding pads are electrically connected to the substrate by bonding wires.

6. The structure of claim 1, wherein the chip package comprises a solder mask defined as an (SMD) type or non-solder mask defined as an (NSMD) type.

7. The structure of claim 1, wherein the substrate comprises a tape wiring substrate or a printed circuit board.

8. The structure of claim 1, wherein the substrate has a window, the plurality of bonding pads are located within the window, and the bonding pads are electrically connected to the substrate by bonding wires passing through the window.

9. The structure of claim 8, wherein I/O solder balls and the dummy solder balls are symmetrically provided with regard to the window.

10. The structure of claim 1, wherein the I/O solder balls and the dummy solder balls comprises of the same material.

11. A mounting structure of a BGA semiconductor chip package, the mounting structure comprising:
    a BGA semiconductor chip package including:
    a substrate having first and second surfaces;
    a semiconductor chip mounted on the first surface of the substrate, and having a plurality of bonding pads on a side not mounted to the substrate;
    plurality of in/out (I/O) solder balls and dummy solder balls provided on the second surface of the substrate; and
    a mounting substrate including connection pads and one or more protective layers, wherein the I/O solder balls are connected to the connection pads and the dummy solder balls are connected to the one or more protective layers and the I/O solder balls and the dummy solder balls have the same ball size and ball pitch, and wherein a height of the one or more protective layers is higher than a height of the connection pads.

12. The structure of claim 11, further comprising a second set of dummy solder balls of the plurality of dummy solder balls disposed inside of the plurality of I/O solder balls.

13. The structure of claim 11, wherein the I/O solder balls and the dummy solder balls are provided in a matrix arrangement.

14. The structure of claim 11, wherein the bonding pads are electrically connected to the substrate by bonding wires.

15. The structure of claim 11, wherein the chip package comprises a solder mask defined as an (SMD) type or non-solder mask defined (NSMD) type.

16. The structure of claim 11, wherein the substrate comprises a tape wiring substrate or a printed circuit board.

17. A mounting structure of a BGA semiconductor chip package, the mounting structure comprising:
    a BGA semiconductor chip package including:
    a substrate having first surface, second surface, and a window therein;
    a semiconductor chip mounted on the first surface of the substrate, and having a plurality of bonding pads provided within the window;
    plurality of in/out (I/O) solder balls and dummy solder balls provided on the second surface of the substrate; and a mounting substrate including connection pads and one or more protective layers, wherein the I/O solder balls are connected to the connection pads and the dummy solder balls are connected to the one or more protective layers and the I/O solder balls and the dummy solder balls have the same ball size and ball pitch, and wherein a height of the one or more protective layers is higher than a height of the connection pads.

18. The structure of claim 17, wherein the semiconductor chip comprises a center type semiconductor chip, and the bonding pads are electrically connected to the substrate by bonding wires passing through the windows.

19. The structure of claim 17, wherein the I/O solder balls and dummy solder balls are provided in a matrix arrangement and symmetrically provided with regard to the window.

20. The structure of claim 19, wherein the dummy solder balls are provided on a periphery of the substrate.

* * * * *